(12) United States Patent
Zhang

(10) Patent No.: US 11,417,738 B2
(45) Date of Patent: Aug. 16, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Qingchun Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 126 days.

(21) Appl. No.: 17/004,937

(22) Filed: Aug. 27, 2020

(65) Prior Publication Data

US 2021/0066462 A1 Mar. 4, 2021

(30) Foreign Application Priority Data

Sep. 4, 2019 (CN) .......................... 201910833224.3

(51) Int. Cl.
*H01L 27/092* (2006.01)
*H01L 29/417* (2006.01)
(Continued)

(52) U.S. Cl.
CPC .. *H01L 29/41766* (2013.01); *H01L 21/02529* (2013.01); *H01L 21/02532* (2013.01); *H01L 21/02546* (2013.01); *H01L 21/02576* (2013.01); *H01L 21/02579* (2013.01); *H01L 21/26513* (2013.01); *H01L 21/28518* (2013.01); *H01L 21/308* (2013.01); *H01L 21/30604* (2013.01); *H01L 29/0847* (2013.01); *H01L 29/401* (2013.01); *H01L 29/45* (2013.01)

(58) Field of Classification Search
CPC ......... H01L 21/31116; H01L 21/76858; H01L 21/76843; H01L 29/41766; H01L 29/0847; H01L 23/5226; H01L 29/66636; H01L 21/76807
See application file for complete search history.

(56) References Cited

U.S. PATENT DOCUMENTS

2015/0170966 A1\* 6/2015 Tung ................. H01L 21/76897 438/618
2019/0122920 A1\* 4/2019 Su ......................... H01L 23/485
2020/0168723 A1\* 5/2020 Hsu ................... H01L 29/66636

\* cited by examiner

*Primary Examiner* — Brian Turner
(74) *Attorney, Agent, or Firm* — Anova Law Group, PLLC

(57) ABSTRACT

Semiconductor structures and fabrication methods thereof are provided. The method includes: providing a substrate, the substate having a first opening; forming a first epitaxial layer in the first opening, the first epitaxial layer having a second opening; forming a stop layer on sidewall surfaces and a bottom surface of the second opening; forming a second epitaxial layer on a top surface of the stop layer; after forming the second epitaxial layer, forming a dielectric layer on the substrate, the dielectric layer having a third opening exposing a surface of the second epitaxial layer; forming a fourth opening in the second epitaxial layer by etching the second epitaxial layer exposed by the third opening until the stop layer is exposed; and forming a contact layer on sidewall surfaces and a bottom surface of the fourth opening by performing a semiconductor metallization process.

20 Claims, 7 Drawing Sheets

(51) Int. Cl.
*H01L 21/8238* (2006.01)
*H01L 29/66* (2006.01)
*H01L 29/45* (2006.01)
*H01L 29/08* (2006.01)
*H01L 29/40* (2006.01)
*H01L 21/02* (2006.01)
*H01L 21/285* (2006.01)
*H01L 21/306* (2006.01)
*H01L 21/308* (2006.01)
*H01L 21/265* (2006.01)

SEMICONDUCTOR STRUCTURE AND FABRICATION METHOD THEREOF

CROSS-REFERENCES TO RELATED APPLICATION

This application claims the priority of Chinese Patent Application No. 201910833224.3, filed on Sep. 4, 2019, the content of which is incorporated by reference in its entirety.

TECHNICAL FIELD

The present disclosure generally relates to the field of semiconductor manufacturing technology and, more particularly, relates to semiconductor structure and fabrication method of the semiconductor structure.

BACKGROUND

With the continuous development of semiconductor technology, the critical dimension of semiconductor structure has gradually become smaller. The reduction of critical dimension means that a larger number of transistors may be integrated into a single chip. As such, stricter requirements are brought up on the semiconductor processes.

A metal contact layer is often used to provide an electrical connection between a doped source-drain region and an external circuit in semiconductor devices. However, due to a large difference between the Fermi levels of the metal and the doped source-drain region, a potential barrier between the metal contact layer and the doped source-drain doped layer is high, which may cause a high contact resistance between the metal contact layer and the doped source-drain region. The contact resistance is usually reduced by increasing the surface area of the metal silicide between the metal contact layer and the doped source-drain region to improve the performance of the semiconductor structure.

However, conventionally formed metal contact layer has poor quality, which affects the device performance and yield of the formed semiconductor structure. The disclosed structure and method are directed to at least partially alleviate one or more problems set forth above and to solve other problems in the art.

SUMMARY

Embodiments and implementations of the present disclosure provide a semiconductor structure and a formation method to improve the quality of the formed contact layer, so that the semiconductor structure is formed with desirable device performance and high yield.

One aspect of the present disclosure provides a method for forming a semiconductor structure. The method includes: providing a substrate, the substate having a first opening; forming a first epitaxial layer in the first opening, the first epitaxial layer having a second opening; forming a stop layer on sidewall surfaces and a bottom surface of the second opening; forming a second epitaxial layer on the stop layer; forming a dielectric layer on the substrate, the dielectric layer having a third opening exposing a surface of the second epitaxial layer; forming a fourth opening in the second epitaxial layer by etching the second epitaxial layer exposed by the third opening until the stop layer is exposed; and forming a contact layer on sidewall surfaces and a bottom surface of the fourth opening by performing a semiconductor metallization process.

Optionally, the first opening is formed by: forming a first mask structure on the substrate; forming a first patterned layer on the first mask structure, the first patterned layer having an opening to expose a portion of the first mask structure; forming the first opening by etching the portion of the first mask structure and the substrate by using the first patterned layer as a mask; and removing the first patterned layer and the first mask structure.

Optionally, forming the dielectric layer on the substrate with the third opening includes: forming an initial dielectric layer on the substrate; forming a second mask structure on the initial dielectric layer; forming a second patterned layer on the second mask structure, the second patterned layer having an opening exposing a portion of the second mask structure; forming the dielectric layer with the third opening by etching the portion of the second mask structure and the initial dielectric layer using the second patterned layer as a mask until the surface of the second epitaxial layer is exposed; and removing the second patterned layer and the second mask structure.

Optionally, the stop layer is made of a semiconductor material doped with first type ions, and the semiconductor material includes silicon, germanium, silicon germanium, silicon carbide, gallium arsenide, indium gallium, or a combination thereof.

Optionally, the first epitaxial layer is doped with the first type ions.

Optionally, the first epitaxial layer is doped with the first type ions by an in-situ doping process.

Optionally, the second epitaxial layer is doped with the first type ions, and a doping concentration of the first type ions in the second epitaxial layer is lower than a doping concentration of the first type ions in the stop layer.

Optionally, the second epitaxial layer is doped with the first type ions by an in-situ doping process.

Optionally, the first type ions are P-type ions, the P-type ions including boron ions, indium ions, or a combination thereof, or the first type of ions are N-type ions, the N-type ions including phosphorus ions, arsenic ions, or a combination thereof.

Optionally, a process for forming the first epitaxial layer includes a first epitaxial deposition process, a process for forming the stop layer includes a first epitaxial deposition process, a process for forming the second epitaxial layer includes a second epitaxial deposition process, and a thickness of the stop layer is in a range from 1 nm to 5 nm.

Optionally, the method further includes forming sidewall spacers on sidewall surfaces of the third opening.

Optionally, the sidewall spacers are made of a material including silicon oxide, silicon nitride, or a combination thereof, and a process for forming the sidewall spacers includes an atomic layer deposition process, a chemical vapor deposition process, a physical vapor deposition process, or a combination thereof.

Optionally, a bottom of the third opening extends into the second epitaxial layer, wherein the sidewall spacers are further located on sidewall surfaces of the second epitaxial layer exposed by the sidewall surfaces of the extended third opening.

Optionally, each sidewall of the fourth opening includes a vertex angle extending towards the substrate.

Optionally, a process for forming the fourth opening includes a wet etching process. An etching solution for the wet etching process includes an alkaline solution. The alkaline solution includes ammonia ($NH_3 \cdot H_2O$), tetramethyl ammonium hydroxide solution (TMAH), or a combination thereof.

Optionally, the method further includes after forming the fourth opening, performing an ion implantation process on the second epitaxial layer before forming the contact layer. Ions used for the ion implantation process include phosphorus ions, arsenic ions, or a combination thereof.

Optionally, the method further includes after performing the ion implantation process on the second epitaxial layer, performing a pre-amorphization implantation (PAI) process on the second epitaxial layer before forming the contact layer.

Optionally, forming the contact layer includes forming an initial contact layer in the fourth opening; and forming the contact layer by performing an annealing process on the initial contact layer. The initial contact layer is made of a material of metal.

Another aspect of the present disclosure provides a semiconductor structure. The semiconductor structure includes: a substrate, the substate having a first opening; a first epitaxial layer in the first opening, the first epitaxial layer having a second opening; a stop layer on sidewall surfaces and a bottom surface of the second opening; a second epitaxial layer on the stop layer; a dielectric layer on the substrate, the dielectric layer having a third opening exposing a surface of the second epitaxial layer; a fourth opening in the second epitaxial layer, the third opening exposing the fourth opening; and a contact layer on sidewall surfaces and a bottom surface of the fourth opening.

Optionally, each sidewall of the contact layer includes a vertex angle extending towards the substrate.

Comparing with the conventional technique, the technical solutions of the present disclosure provide following advantages.

In the technical solutions of the present disclosure, a first epitaxial layer is formed in the substrate; a stop layer and a second epitaxial layer on the surface of the stop layer are formed in the first epitaxial layer; etching is performed on the second epitaxial layer until a top surface of the stop layer is exposed to form a fourth opening; a contact layer is formed on the sidewall surfaces and the bottom surface of the fourth opening. The stop layer is used to define the stop location of the fourth opening forming process, and the stop layer may ensure that the etching is performed only in the second epitaxial layer and does not extend downward through the stop layer. The controllability and accuracy of forming the fourth opening are improved, so that the formation quality of the contact layer is ensured, and the performance and yield of the formed semiconductor structure are improved.

Further, in the technical solutions of the present disclosure, the sidewalls of the fourth opening has a vertex angle (sigma shape) recessed into the substrate. The surface area of formed contact layer may be further increased through the sigma-shaped fourth opening, so that the contact resistance is reduced.

Further, in the technical solutions of the present disclosure, ion implantation is performed on the second epitaxial layer. Since the second epitaxial layer uses a semiconductor material doped with ions of the first type, which has a relatively large resistance, the resistance of the second epitaxial layer can be effectively reduced by performing the ion implantation on the second epitaxial layer, so that the contact resistance is reduced.

Further, in the technical solutions of the present disclosure, the second epitaxial layer is pre-amorphized. By performing the pre-amorphization treatment on the second epitaxial layer, an amorphous layer can be formed in the second epitaxial layer, so that the quality and uniformity of the subsequent formed contact layer, which is made of metal silicide, may be improved. As such, the Schottky barrier of the semiconductor structure is reduced, the contact resistance of the semiconductor structure is reduced, and the electrical performance of the semiconductor structure is improved.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
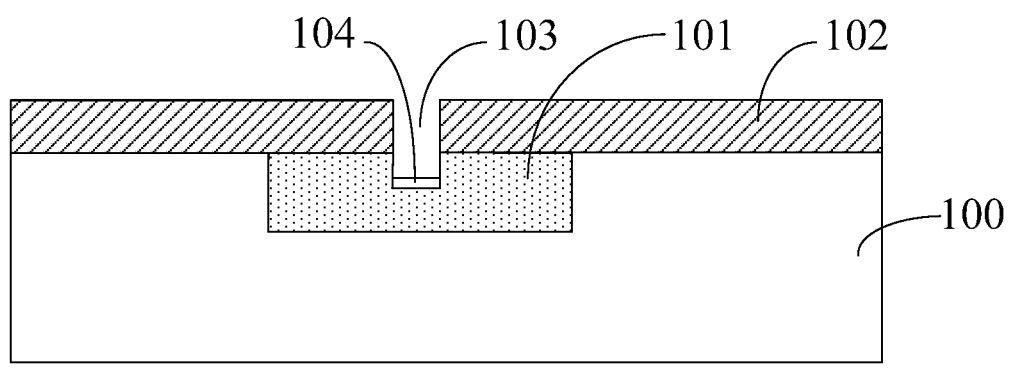
FIGS. 1-2 illustrate schematic cross-sectional views of structures at certain stages of a fabrication process of a semiconductor structure.
Figure 2:
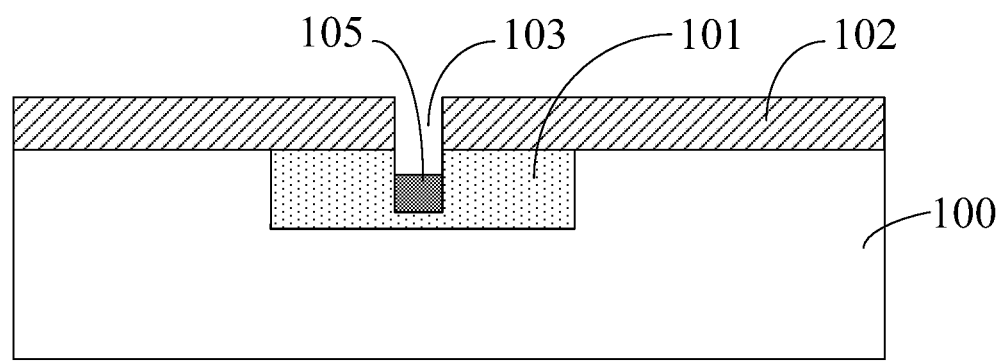

FIGS. 1-2 illustrate schematic cross-sectional views of structures at certain stages of a fabrication process of a semiconductor structure.

As shown in FIG. 1, a substrate 100 may be provided and the substrate 100 has a first opening (not labeled). An epitaxial layer 101 may be formed in the first opening and a dielectric layer 102 may be formed on the substrate 100. The dielectric layer 102 has a second opening 103 exposing a top surface of the epitaxial layer 101. The epitaxial layer 101 exposed at the bottom of the second opening 103 may be etched to form a third opening 104 in the epitaxial layer 101.

As shown in FIG. 2, a semiconductor metallization process may be performed to form a contact layer 105 on the sidewall surfaces and bottom surface of the third opening 104.

In one embodiment, the second opening 103 and the third opening 104 are used to form a conductive structure. The epitaxial layer 101 may be used to form a source-drain region of the transistor. The third opening 104 may help to increase the contact area between the conductive structure and the source-drain region, so that the contact resistance between the conductive structure and the source-drain region may be reduced.

When the third opening 104 is formed by etching the epitaxial layer 101, the etching depth of the third opening 104 may be controlled through duration of the etching process. However, the etching process has different etching rates for different materials. Therefore, uncontrollability and uncertainty may exist in controlling the etching depth through the duration of the etching time, which can easily cause the epitaxial layer to be penetrated or the depth of the third opening 104 to exceed a preset depth.

The present disclosure provides a semiconductor structure and a fabrication method. The method includes: forming a first epitaxial layer in the substrate; forming a stop layer in the first epitaxial layer and a second epitaxial layer on the surface of the stop layer; forming a fourth opening by etching the second epitaxial layer until the top surface of the stop layer is exposed; and performing a semiconductor metallization process to form a contact layer on the sidewall surfaces and the bottom surface of the fourth opening. By taking advantage of the etching selectivity of the stop layer and the second epitaxial layer, the etching may be ensured to be performed only in the second epitaxial layer and not to extend down through the stop layer. As such, the controllability and accuracy of the fourth opening are improved, the formation quality of the contact layer may be ensured, and the performance and yield of the formed semiconductor structure are improved.

In order to make the above-mentioned objects, features and advantages of the present disclosure more obvious and understandable, the embodiments of the present disclosure will be described in detail below with the accompanying FIGS. 3-13.

FIGS. 3-12 illustrate schematic cross-sectional views of structures at certain stages of an exemplary method for fabricating a semiconductor structure consistent with some embodiments of the present disclosure. FIG. 13 illustrates a flowchart of an exemplary method for fabricating a semiconductor structure consistent with some embodiments of the present disclosure.

Figure 3:
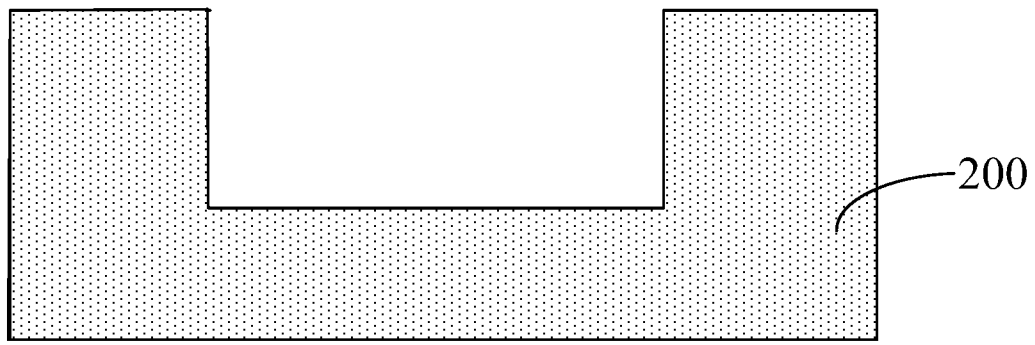
FIGS. 3-12 illustrate schematic cross-sectional views of structures at certain stages of an exemplary method for fabricating a semiconductor structure consistent with some embodiments of the present disclosure.

Referring to FIG. 13, at beginning of the fabrication process, a substrate may be provided (S301). FIG. 3 illustrates a schematic cross-sectional view of a corresponding semiconductor structure consistent with various embodiments of the present disclosure.

As shown in FIG. 3, the substrate 200 may be provided. The substrate 200 may have a first opening (not labeled).

In one embodiment, the material of the substrate 200 may be silicon. In one embodiment, the material of the substrate may be germanium, silicon germanium, silicon carbide, gallium arsenide, indium gallium, or a combination thereof. In one embodiment, the substrate 200 may be a silicon substrate on an insulator or a germanium substrate on an insulator.

In one embodiment, the method for forming the first opening includes: forming a first mask structure (not shown) on the substrate 200; forming a first patterned layer on the first mask structure (not shown), the first patterned layer having an opening to expose a portion of the first mask structure; etching the portion of the first mask structure by using the first patterned layer as a mask to form the first opening; after the first opening is formed, removing the first patterned layer and the first mask structure.

In one embodiment, the first mask structure includes a first mask layer on the substrate 200 and a second mask layer on the first mask layer. In one embodiment, the first mask structure may be a single-layer mask layer.

In one embodiment, the material of the first mask layer may be nitrogen-doped silicon oxycarbide. The first mask layer formed by nitrogen-doped silicon oxycarbide may have good bonding ability with the substrate. When the substrate 200 is subsequently etched by using the etched first mask layer as a mask, the first mask layer may be less likely to peel or warp, so that the first mask layer can keep etching pattern in good shape. As such, the profile of the first opening formed in the substrate 200 may be good and the accuracy of the patterning can be effectively improved after etching.

In one embodiment, the material of the second mask layer may be titanium nitride. The bonding ability between the second mask layer and the first mask layer is good. The second mask layer may protect the surface of the first mask layer during the subsequent etching of the substrate 200, so that the first mask layer will not be thinned. In addition, the physical strength of the second mask layer may be relatively big. Therefore, when the substrate 200 is subsequently etched, the patterns of the second mask layer and the first mask layer can be kept stable, which may help forming openings with good profiles.

In one embodiment, the material of the second mask layer may be silicon carbide, silicon carbonitride, silicon oxynitride, silicon oxynitride, boron nitride, boron carbonitride, or a combination thereof.

In one embodiment, the first mask layer and the second mask layer are formed by an atomic layer deposition process. The first mask layer and the second mask formed by the atomic layer deposition process have the characteristics of uniformity and precision, which may ensure that the profile of the formed first opening are good and accurate. In one embodiment, the first mask layer and the second mask layer may be formed by a chemical vapor deposition process, a physical vapor deposition process, a spin coating process, or a combination thereof.

The material of the first patterned layer includes photoresist. The forming process of the first patterned layer includes a photolithographic patterning process. The process of removing the first patterned layer includes a wet stripping process, an ashing process, or a combination thereof. The gas for the ashing process may be an oxygen-containing gas, such as oxygen, ozone, or a combination thereof.

In one embodiment, the process to remove the first mask structure may be a wet etching process. In one embodiment, the process to remove the first mask structure may be a dry etching process.

Figure 4:
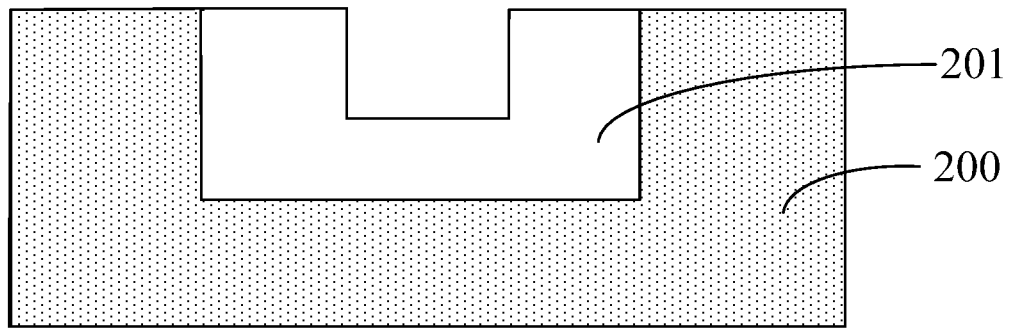

Referring to FIG. 13, a first epitaxial layer may be further formed in the first opening (S302). FIG. 4 illustrates a schematic cross-sectional view of a corresponding semiconductor structure consistent with various embodiments of the present disclosure.

As shown in FIG. 4, the first epitaxial layer 201 may be formed in the first opening, and the first epitaxial layer 201 has a second opening (not labelled).

In one embodiment, the first epitaxial layer 201 may be formed by an epitaxial deposition process.

Figure 5:
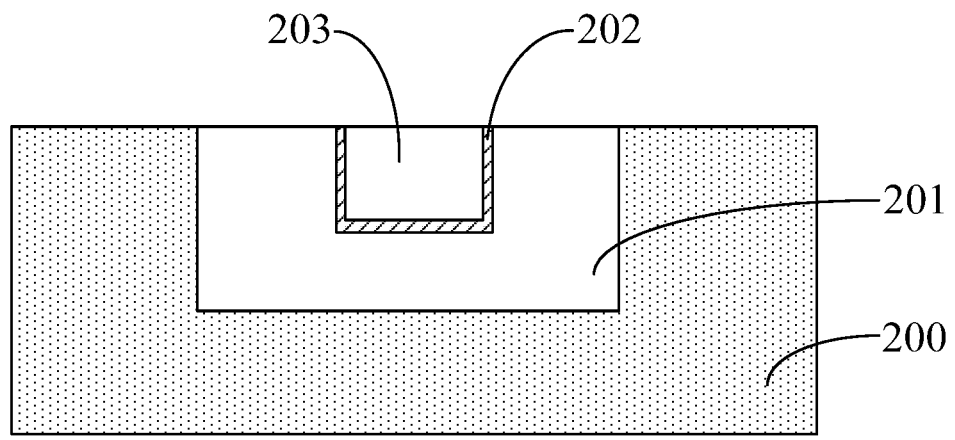

Referring to FIG. 13, a stop layer is further formed on sidewall surfaces and a bottom surface of the second opening (S303) and a second epitaxial layer is further formed on the surface of the stop layer 202 (S304). FIG. 5 illustrates a schematic cross-sectional view of a corresponding semiconductor structure consistent with various embodiments of the present disclosure.

As shown in FIG. 5, the stop layer 202 and the second epitaxial layer 203 on the surface of the stop layer 202 are formed on the sidewall surfaces and bottom surface of the second opening.

In one embodiment, the processes for forming the stop layer 202 and the second epitaxial layer 203 may be epitaxial deposition processes. The thickness of the stop layer 202 may be 1 nm to 5 nm, and the thickness refers to a dimension of the stop layer 202 in a direction perpendicular to the sidewall surfaces of the first opening.

The material of the stop layer 202 may be a semiconductor material doped with first type ions. In one embodiment, the semiconductor material includes silicon. In one embodiment, the semiconductor material includes germanium, silicon germanium, silicon carbide, gallium arsenide, indium gallium, or a combination thereof.

In one embodiment, the first epitaxial layer 201 may be doped with first type ions. The process of doping the first epitaxial layer 201 with first type ions may be an in-situ doping process.

In one embodiment, the second epitaxial layer 203 may be doped with first type ions. The doping concentration of the first type ions in the second epitaxial layer 203 may be less than the doping concentration of the first type ions in the stop layer 202.

In one embodiment, the process of doping the first type ions in the second epitaxial layer 203 may be an in-situ doping process.

In one embodiment, the first type ions are P-type ions, and the P-type ions are boron ions. In one embodiment, the P-type ions may be indium ions. In one embodiment, the first type of ions may be N-type ions and the N-type ions may be phosphorus ions, arsenic ions, or a combination thereof.

In one embodiment, the concentration of the first type ions doped in the stop layer 202 may be greater than $1E20/cm^3$ and the concentration of the first type ions doped in the second epitaxial layer 203 may be less than $1E19/cm^3$.

Figure 6:
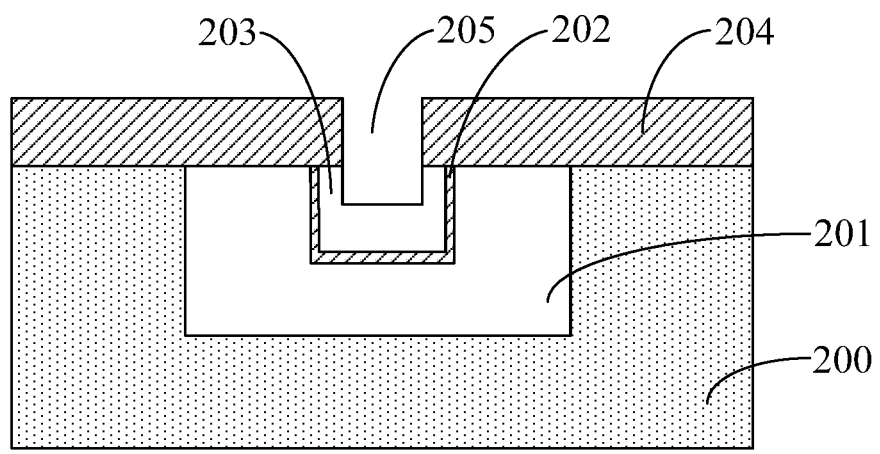
Figure 7:
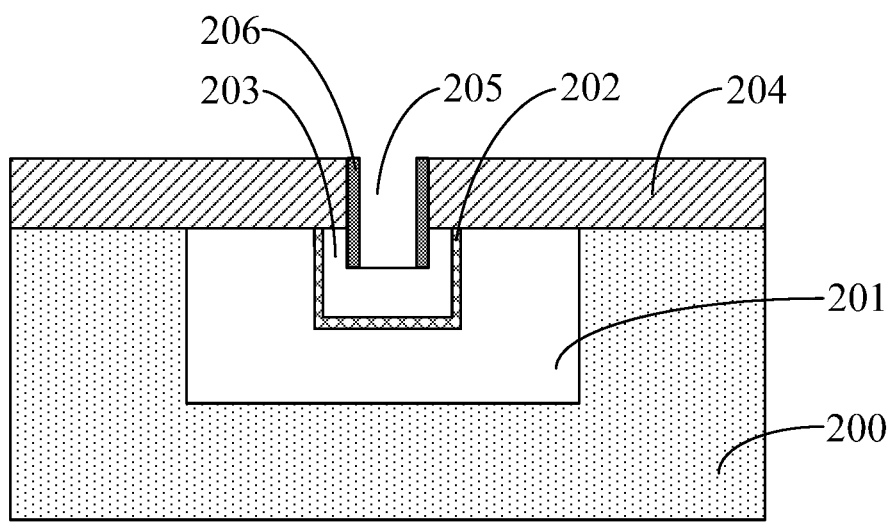

Referring to FIG. 13, after forming the second epitaxial layer, a dielectric layer is further formed on the substrate and the dielectric layer has a third opening exposing a surface of the second epitaxial layer (S305). FIGS. 6-7 illustrate a schematic cross-sectional view of a corresponding semiconductor structure consistent with various embodiments of the present disclosure.

As shown in FIG. 6, after forming the second epitaxial layer 203, the dielectric layer 204 may be formed on the substrate 200. The dielectric layer 204 has the third opening 205 exposing a top surface of the second epitaxial layer 203.

In one embodiment, the dielectric layer 204 may be formed on a top surface of the substrate 200, a top surface of the first epitaxial layer 201, a top surface of the stop layer 202, and the top surface of the second epitaxial layer 203.

In one embodiment, the method for forming the dielectric layer 204 and the third opening 205 includes: forming an initial dielectric layer on the substrate 200; forming a second mask structure on the initial dielectric layer (not shown); forming a second patterned layer (not shown) on the second mask structure, the second patterned layer having an opening that exposes a portion of the second mask structure; etching a portion of the second mask structure and the initial dielectric layer using the second patterned layer as a mask until the surface of the second epitaxial layer is exposed to form the dielectric layer 204 and the third opening 205; and after forming the dielectric layer 204 and the third opening 205, removing the second patterned layer and the second mask structure.

The material of the initial dielectric layer includes silicon dioxide, silicon nitride, a low-k dielectric material (low-k dielectric material refers to a dielectric material with a relative dielectric constant being smaller than 3.9), an ultra-low-k dielectric material (ultra-low-k dielectric material refers to a dielectric material with a relative dielectric constant being smaller than 2.5), or a combination thereof.

When the material of the initial dielectric layer is a low-k dielectric material, an ultra-low-k dielectric material, or a combination thereof, the material of the initial dielectric layer may be carbon silicon oxyhydride (SiCOH), fluorine-doped silicon glass (FSG), borosilicate glass (BSG), phosphosilicate glass (PSG), Borophosphosilicate Glass (BPSG), hydrogenated silsesquioxane, methylsilsesquioxane, or a combination thereof.

In one embodiment, the material of the initial dielectric layer may be an ultra-low-k dielectric material (a relative dielectric constant being smaller than 2.5). The ultra-low-k dielectric material may be carbon silicon oxyhydride (SiCOH).

The process of forming the initial dielectric layer includes an atomic layer deposition process, a chemical vapor deposition, a physical vapor deposition process, a spin coating process, or a combination thereof. In one embodiment, the initial dielectric layer may be formed by a chemical vapor deposition process.

In one embodiment, the second mask structure may include a first mask layer and a second mask layer, as described above. In another embodiment, the second mask structure may be a single layer structure.

In one embodiment, the material of the second patterned layer includes photoresist. The forming process of the second patterned layer includes a photolithography patterning process.

The process of removing the second patterned layer includes a wet stripping process, an ashing process, or a combination thereof. The gas for the ashing process may be an oxygen-containing gas, such as oxygen and ozone.

As shown in FIG. 7, sidewall spacers 206 may be formed on the sidewall surfaces of the third opening 205.

In one embodiment, the material of the sidewall spacers 206 includes silicon oxide. In one embodiment, the material of the sidewall spacers may be silicon nitride.

In one embodiment, the forming process of the sidewall spacers 206 may be an atomic layer deposition process. In one embodiment, the forming process of the sidewall spacers 206 may be a chemical vapor deposition process, a physical vapor deposition process, or a combination thereof.

The purpose to form the sidewall spacers 206 on the sidewall surfaces of the third opening 205 is to reduce the characteristic size of the conductive plug formed later.

Figure 8:
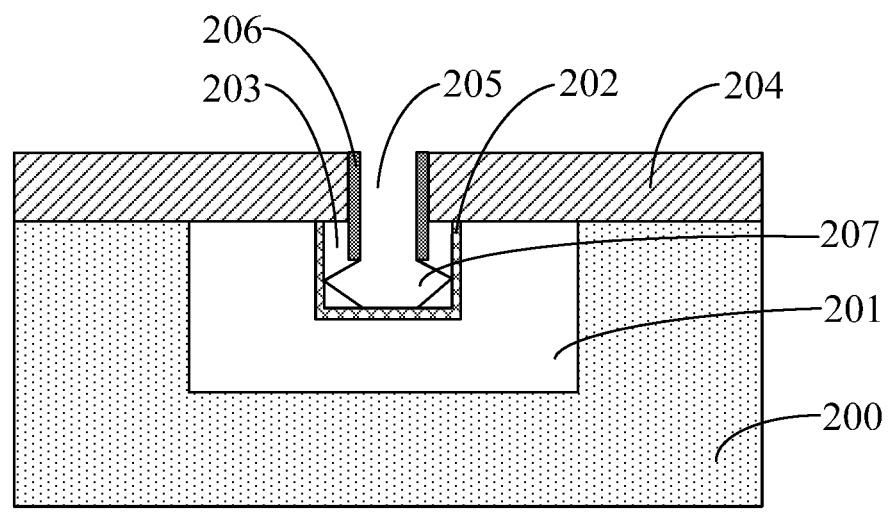

Referring to FIG. 13, a fourth opening 207 is further formed by etching the second epitaxial layer 203 until the top surface of the stop layer 202 is exposed (S306). FIG. 8 illustrates a schematic cross-sectional view of a corresponding semiconductor structure consistent with various embodiments of the present disclosure.

As shown in FIG. 8, the second epitaxial layer 203 exposed at the bottom of the third opening 206 may be etched until the stop layer 202 is exposed to form the fourth opening 207 in the second epitaxial layer 203.

Since the concentration of the doped first type ions in the stop layer 202 is different from the concentration of the first type doped ions in the second epitaxial layer 203, the etching solution has an etching selectivity between the second epitaxial layer 203 and the stop layer 202, which can ensure that the etching is performed only in the second epitaxial layer 203 until the stop layer 202 is exposed.

In one embodiment, the bottom of the third opening 205 extends into the second epitaxial layer 203. The sidewall spacers 206 may be located on the sidewall surfaces of the second epitaxial layer 203 exposed by the sidewall surfaces of the third opening 205.

In one embodiment, the sidewalls of the fourth opening 207 has a vertex angle (sigma-shaped) recessed to the substrate 200. The surface area of the contact layer can be further increased by the sigma-shaped fourth opening 207, which in turn reduces the contact resistance.

In one embodiment, the process for forming the fourth opening 207 may be a wet etching process. The etching solution for the wet etching process may be an alkaline solution.

In one embodiment, the alkaline solution uses tetramethyl ammonium hydroxide solution (TMAH). Since the etching rates of the tetramethylammonium hydroxide solution to the crystal plane family {100} and {110} of the silicon substrate are greater than that to the crystal plane family {111} of the silicon substrate, the four opening 207 may be formed as a sigma-shaped groove. The tetramethylammonium hydroxide solution has the advantages, such as good crystal orientation selectivity, high etching rate, non-toxic, non-polluting, and easy to operate. Surfactants may also be added to the tetramethylammonium hydroxide solution.

In one embodiment, the alkaline solution may be ammonia ($NH_3 \cdot H_2O$).

Referring to FIG. 13, a contact layer is further formed on sidewall surfaces and a bottom surface of the fourth opening by performing a semiconductor metallization process (S307). FIGS. 9-12 illustrate a schematic cross-sectional view of a corresponding semiconductor structure consistent with various embodiments of the present disclosure.

Figure 9:
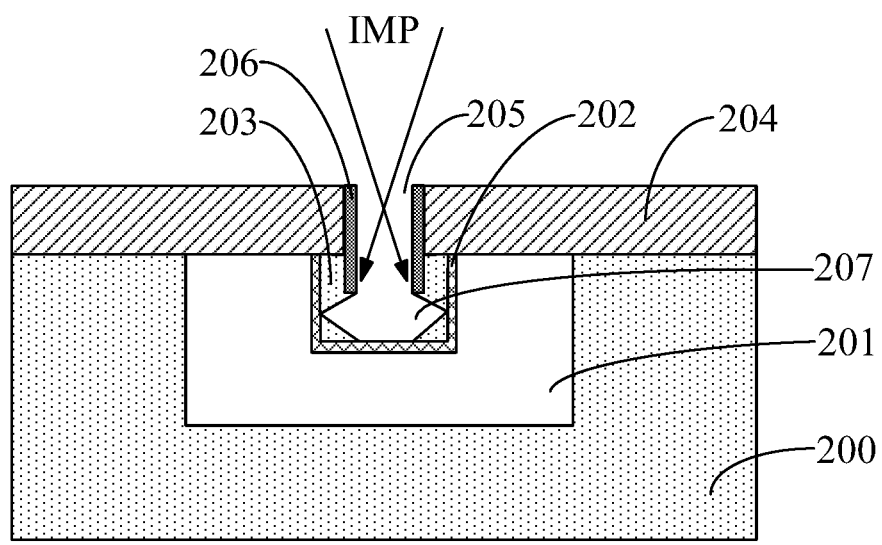

As shown in FIG. 9, after the fourth opening 207 is formed, ion implantation (Ion-implantation, IMP) may be performed on the second epitaxial layer 203.

In one embodiment, the ions used for the ion implantation include boron ions. In one embodiment, the ions used for the ion implantation include phosphorus ions, arsenic ions, or a combination thereof.

In one embodiment, the second epitaxial layer 203 may be made of a semiconductor material doped with the first type ions and the resistance of the semiconductor material may be large. The resistance of the second epitaxial layer 203 may be effectively reduced by performing the ion implantation on the second epitaxial layer 203, so that the contact resistance may be reduced.

Figure 10:
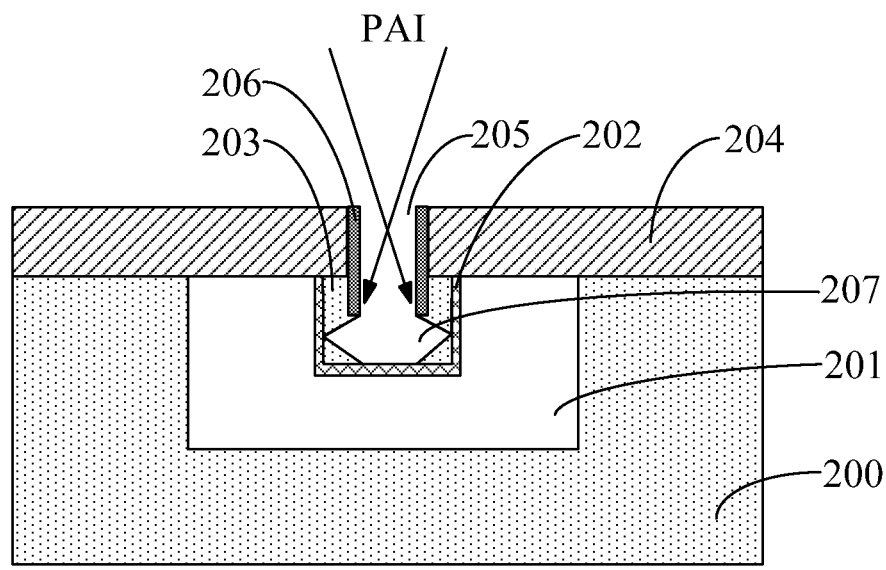

As shown in FIG. 10, after ion implantation is performed on the second epitaxial layer 203, a pre-amorphization implantation (PAI) treatment may be performed on the fourth opening 207.

By performing the pre-amorphization implantation treatment on the second epitaxial layer 203, an amorphous layer may be formed in the second epitaxial layer 203, so that the quality and uniformity of the subsequent formed contact layer, which is made of metal silicide, may be improved. Thus, the Schottky barrier of the semiconductor structure may be lowered, the contact resistance of the semiconductor structure may be reduced, and the electrical performance of the semiconductor structure may be improved.

The doping ions used in the pre-amorphization ion implantation treatment on the second epitaxial layer 203 are one or more of carbon, germanium, and silicon. In one embodiment, the doping ions are carbon. The process parameters of the pre-amorphization ion implantation treatment include: the implantation energy of the doping ions may be 5 keV to 20 keV, and the implantation dose of the doping ions may be $4.0E13$ atom/cm$^2$ to $2.3E15$ atom/cm$^2$.

In one embodiment, both the ion implantation and the pre-amorphization ion implantation treatment are tilted implantations. The angle of the tilted implantations may be determined by the aspect ratio of the third opening 205. The area covered by ions may be increased by performing the tilted implantations, so that both the bottom surface and sidewall surfaces of the fourth opening 207 are ensured to be covered.

In one embodiment, a semiconductor metallization process may be subsequently performed to form a contact layer on the sidewall surfaces and the bottom surface of the fourth opening 207. The details are shown in FIG. 11 and FIG. 12.

Figure 11:
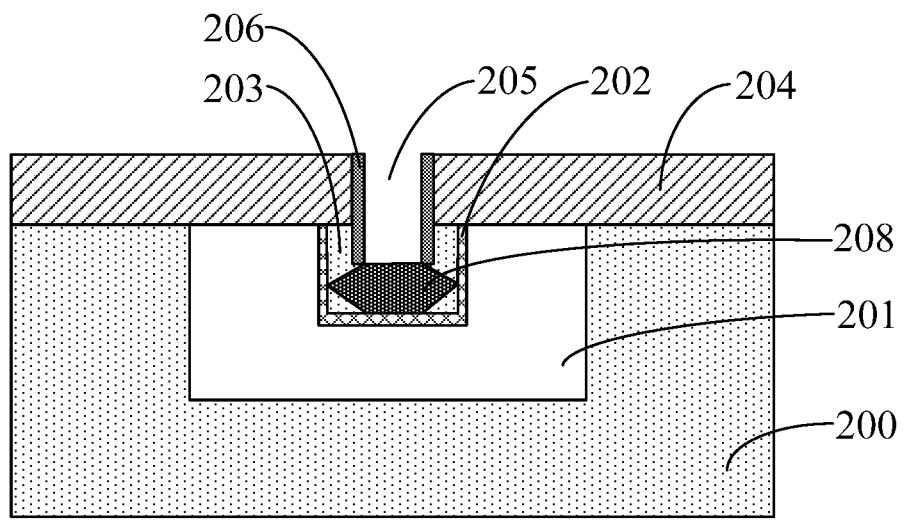

As shown in FIG. 11, an initial contact layer 208 may be formed in the fourth opening 207.

The material of the initial contact layer 208 may be a metal. The metal includes titanium, nickel, doped platinum, or a combination thereof. In one embodiment, the material of the initial contact layer 208 may be titanium.

Figure 12:
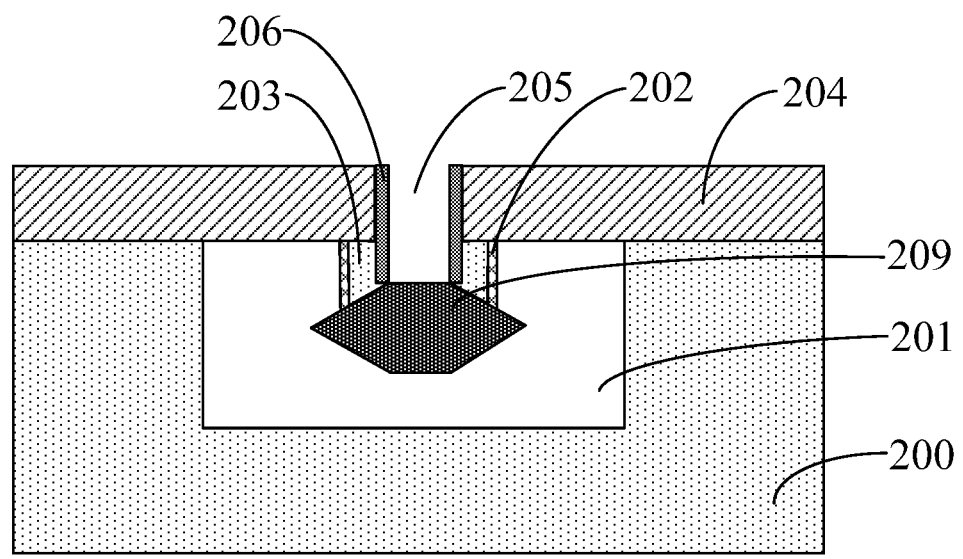
Figure 13:
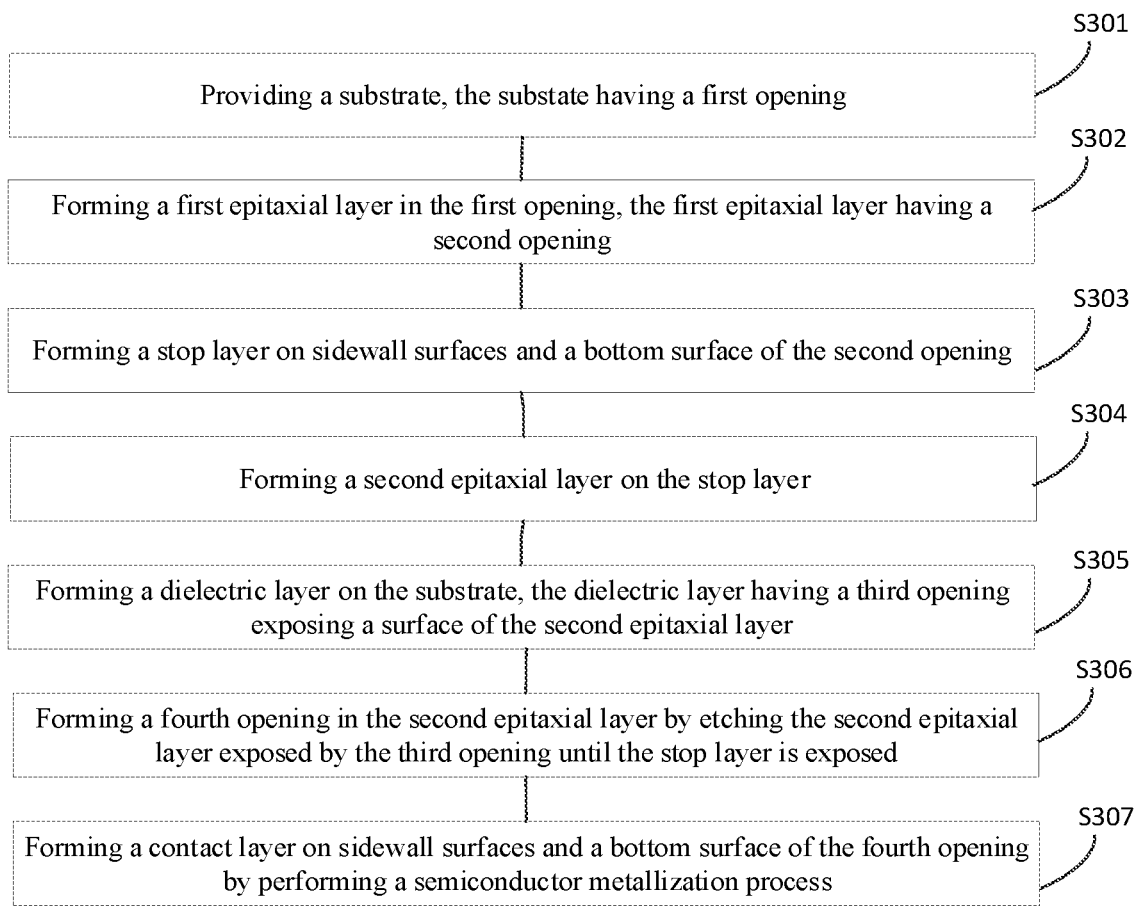
FIG. 13 illustrates a flowchart of an exemplary method for fabricating a semiconductor structure consistent with some embodiments of the present disclosure.

As shown in FIG. 12, the initial contact layer 208 may be annealed to form the contact layer 209.

In one embodiment, the material of the initial contact layer 208 may be titanium. The material of the first epitaxial layer 201 and the second epitaxial layer 203 may be silicon. As such, during the annealing process, the titanium atoms in the initial contact layer 208 may diffuse and react with the silicon atoms in the first epitaxial layer 201 as well as the second epitaxial layer 203, so that a contact layer 209 made of titanium silicide (TiSi) may be formed. In one embodiment, the material of the initial contact layer 208 may be nickel. Correspondingly, the material of the contact layer may be nickel silicide (NiSi).

In one embodiment, the annealing treatment may be a laser annealing treatment. The process pressure of the laser annealing treatment may be one standard atmospheric pressure (atm). In one embodiment, the annealing treatment may be a rapid thermal annealing treatment.

It should be noted that, in order to ensure the effect of the reaction between the metal layer and the first epitaxial layer 201 as well as the second epitaxial layer 203, so that the thickness and quality of the formed the contact layer 209 meet the process requirements and adverse effects caused by the doping ions previously existed in the substrate 200 is prevented, the annealing temperature may be 350° C. to 900° C. in one embodiment.

It should also be noted that the thickness of the contact layer 209 affects the contact resistance of the contact area. When the thickness of the contact layer is too large, the coverage of the initial contact layer 208 on the surface of the fourth opening 207 may be poor and defects are likely to occur in the contact layer 209. As a result, the quality of the formed contact layer may be lowered and the electrical performance of the formed semiconductor structure may be further affected. Therefore, in order to make the electrical performance of the formed semiconductor structure meet the process requirements, the thickness of the contact layer 209 may be 5 nm to 30 nm.

In one embodiment, a physical vapor deposition process may be used to form the initial contact layer 208. In one embodiment, the process for forming the initial contact layer may be a chemical vapor deposition process, an atomic layer deposition process, or a combination thereof.

As shown in FIG. 12, the present disclosure also provides an exemplary semiconductor structure formed by the above method. The semiconductor structure includes: a substrate 200, having a first opening; an epitaxial layer 201, having a second opening in the first epitaxial layer 201; a stop layer 202 on the sidewall surfaces and bottom surface of the second opening; a second epitaxial layer 203 on the surface of the stop layer 202; a dielectric layer 204 on the substrate 200, the dielectric layer 204 having a third opening 205 exposing the surface of the second epitaxial layer 203; a fourth opening 207 in the second epitaxial layer 203, the third opening 205 exposing the fourth opening 207; and the contact layer 209 on the sidewall surfaces and the bottom surface of the fourth opening 207.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor structure, comprising:
   providing a substrate, the substrate having a first opening;
   forming a first epitaxial layer in the first opening, the first epitaxial layer having a second opening;
   forming a stop layer on sidewall surfaces and a bottom surface of the second opening;
   forming a second epitaxial layer on the stop layer;
   forming a dielectric layer on the substrate, the dielectric layer having a third opening exposing a surface of the second epitaxial layer;
   forming a fourth opening in the second epitaxial layer by etching the second epitaxial layer exposed by the third opening until the stop layer is exposed; and
   forming a contact layer on sidewall surfaces and a bottom surface of the fourth opening by performing a semiconductor metallization process.

2. The method according to claim 1, wherein the first opening is formed by:
   forming a first mask structure on the substrate;
   forming a first patterned layer on the first mask structure, the first patterned layer having an opening to expose a portion of the first mask structure;
   forming the first opening by etching the portion of the first mask structure and the substrate by using the first patterned layer as a mask; and
   removing the first patterned layer and the first mask structure.

3. The method according to claim 1, wherein forming the dielectric layer on the substrate with the third opening includes:
   forming an initial dielectric layer on the substrate;
   forming a second mask structure on the initial dielectric layer;
   forming a second patterned layer on the second mask structure, the second patterned layer having an opening exposing a portion of the second mask structure;
   forming the dielectric layer with the third opening by etching the portion of the second mask structure and the initial dielectric layer using the second patterned layer as a mask until the surface of the second epitaxial layer is exposed; and
   removing the second patterned layer and the second mask structure.

4. The method according to claim 1, wherein:
   the stop layer is made of a semiconductor material doped with first type ions; and
   the semiconductor material includes silicon, germanium, silicon germanium, silicon carbide, gallium arsenide, indium gallium, or a combination thereof.

5. The method according to claim 4, wherein:
   the first epitaxial layer is doped with the first type ions.

6. The method according to claim 5, wherein:
   the first epitaxial layer is doped with the first type ions by an in-situ doping process.

7. The method according to claim 4, wherein:
   the second epitaxial layer is doped with the first type ions, and
   a doping concentration of the first type ions in the second epitaxial layer is lower than a doping concentration of the first type ions in the stop layer.

8. The method according to claim 7, wherein:
   the second epitaxial layer is doped with the first type ions by an in-situ doping process.

9. The method according to claim 7, wherein:
   the first type ions are P-type ions, the P-type ions including boron ions, indium ions, or a combination thereof, or
   the first type of ions are N-type ions, the N-type ions including phosphorus ions, arsenic ions, or a combination thereof.

10. The method according to claim 1, wherein:
    a process for forming the first epitaxial layer includes a first epitaxial deposition process,
    a process for forming the stop layer includes a first epitaxial deposition process,
    a process for forming the second epitaxial layer includes a second epitaxial deposition process, and
    a thickness of the stop layer is in a range from 1 nm to 5 nm.

11. The method according to claim 1, further including:
    forming sidewall spacers on sidewall surfaces of the third opening.

12. The method according to claim 11, wherein:
    the sidewall spacers are made of a material including silicon oxide, silicon nitride, or a combination thereof, and
    a process for forming the sidewall spacers includes an atomic layer deposition process, a chemical vapor deposition process, a physical vapor deposition process, or a combination thereof.

13. The method according to claim 11, wherein:
    a bottom of the third opening extends into the second epitaxial layer, wherein the sidewall spacers are further located on sidewall surfaces of the second epitaxial layer exposed by the sidewall surfaces of the extended third opening.

14. The method according to claim 1, wherein:
    each sidewall of the fourth opening includes a vertex angle extending towards the substrate.

15. The method according to claim 14, wherein:
    a process for forming the fourth opening includes a wet etching process, wherein an etching solution for the wet etching process includes an alkaline solution, and
    the alkaline solution includes ammonia ($NH_3 \cdot H_2O$), tetramethyl ammonium hydroxide solution (TMAH), or a combination thereof.

16. The method according to claim 1, further including:
    after forming the fourth opening, performing an ion implantation process on the second epitaxial layer before forming the contact layer, wherein ions used for the ion implantation process include phosphorus ions, arsenic ions, or a combination thereof.

17. The method according to claim 16, further including:
    after performing the ion implantation process on the second epitaxial layer, performing a pre-amorphization implantation (PAI) process on the second epitaxial layer before forming the contact layer.

18. The method according to claim 1, wherein forming the contact layer includes:
    forming an initial contact layer in the fourth opening; and
    forming the contact layer by performing an annealing process on the initial contact layer, wherein the initial contact layer is made of a material of metal.

19. A semiconductor structure, comprising:
    a substrate, the substrate having a first opening;
    a first epitaxial layer in the first opening, the first epitaxial layer having a second opening;

a stop layer on sidewall surfaces and a bottom surface of the second opening;
a second epitaxial layer on the stop layer;
a dielectric layer on the substrate, the dielectric layer having a third opening exposing a surface of the second epitaxial layer;
a fourth opening in the second epitaxial layer, the third opening exposing the fourth opening; and
a contact layer on sidewall surfaces and a bottom surface of the fourth opening.

20. The semiconductor structure according to claim 19, wherein:
each sidewall of the contact layer includes a vertex angle extending towards the substrate.

\* \* \* \* \*